United States Patent [19]

Kestenbaum

[11] 4,044,222
[45] Aug. 23, 1977

[54] METHOD OF FORMING TAPERED APERTURES IN THIN FILMS WITH AN ENERGY BEAM

[75] Inventor: Ami Kestenbaum, East Windsor Township, Mercer County, N.J.

[73] Assignee: Western Electric Company, Inc., New York, N.Y.

[21] Appl. No.: 649,766

[22] Filed: Jan. 16, 1976

[51] Int. Cl.$^2$ .............................................. B23K 9/00
[52] U.S. Cl. ........................................... 219/121 LM
[58] Field of Search .... 219/121 L, 121 LM, 121 EM; 346/76 L; 178/6.6 B, 6.6 TP; 29/583

[56] References Cited

U.S. PATENT DOCUMENTS

| 3,445,926 | 5/1969 | Medved et al. | 219/121 EM |
| 3,668,028 | 6/1972 | Short | 219/121 LX |
| 3,832,948 | 9/1974 | Barker | 346/76 LX |
| 3,962,558 | 6/1976 | Kocher et al. | 219/121 LM |
| Re. 27,772 | 10/1973 | Hanfmann | 219/121 LM |

OTHER PUBLICATIONS

Bakish, "Intro. to Elect. Beam Tech.," 364–367, copywright 1962.
"Integrated Resistor Trimming" J. A. Parisi, *IBM Technical Disclosure Bulletin*, vol. 17, No. 10, p. 2878, Mar. 1975.
"Two-Pass Laser Cutting" A. S. Shah et al., *IBM Technical Disclosure Bulletin*, vol. 17, No. 10, p. 3237, Mar. 1974.

*Primary Examiner*—C. L. Albritton
*Assistant Examiner*—Fred E. Bell
*Attorney, Agent, or Firm*—J. Rosenstock

[57] ABSTRACT

An energy beam, such as the coherent output of a laser, is applied to a thin film in a controlled manner, preferably as a pluse. The length of the pulse is regulated to form a tapered aperture in the film. The duration, energy and wavelength of the beam pulse with respect to the thickness, thermal properties and optical properties of the film are such that impingement of the beam pulse on a first surface of the film results in controlled removal of a small amount of the film. The pulse is terminated before the temperature gradient between the first film surface and a second film surface (the film's thickness being bounded by the surfaces) is zero. Plural pulses may be serially applied to form the tapered aperture to a desired depth.

Typically, the thin films range in thickness from several hundred angstroms (~400A.) to about 10,000A. and may be dielectrics ($SiO_2$, $Si_3N_4$, $Ta_2O_5$), metals (Au, Al, Ta, etc.) and silicon.

Relative motion of the pulsed beam and the film produces a pattern of tapered holes or, alternatively, a tapered kerf or moat.

9 Claims, 2 Drawing Figures

METHOD OF FORMING TAPERED APERTURES IN THIN FILMS WITH AN ENERGY BEAM

BACKGROUND OF THE INVENTION

1. Field of the Invention

This invention relates to a method of high-temperature machining, and more specifically to a method of forming apertures or windows in materials with a coherent beam of electromagnetic energy. Even more specifically, this invention relates to the formation of tapered apertures in thin dielectric or metal films with the coherent light of a laser.

2. Description of the Prior Art

In many manufacturing sequences, material removal is a necessary step; this is often true in the case of small workpieces, such as ultra small electrical devices commonly referred to as integrated circuits (IC's), discrete semiconductor devices (transistors and diodes) and thin-film devices such as resistors or capacitors. Where IC's or thin-film circuits are concerned, such machining often takes the form of forming small apertures or windows in both dielectric and metal films. These openings typically have dimensions in the micron range for IC's, in the 2-5 mil range for discrete devices, and greater than 5 mils or so for thin-film resistors or capacitors.

The reasons for making these openings are many, but several reasons are more typical than others.

First, in making semiconductor devices (both IC and discrete) a dielectric film is often thermally grown or deposited, over underlying circuits, which may include uni-polar and bi-polar devices, including doped regions and p-n junctions. The purpose of the dielectric film is to passivate and protect these circuits. However, electrical connection to the underlying circuits must be made through the dielectric. This is usually accomplished by making windows through the dielectric film to expose the circuits so that metal conductors can be formed by evaporation, sputtering or plating.

Second, in manufacturing many of the devices discussed above, there is often a requirement for processing steps, such as junction enhancement by ion implantation or by vapor diffusion. Again an aperture or window must be opened, in this case to expose the junction or other desired region for such a step.

Third, so-called mesa devices usually contain a moat surrounding the mesa. This moat exposes the p-n junction below the mesa's top, thus isolating adjacent mesas and their p-n junctions from each other.

Fourth, as described in commonly-assigned U.S. Pat. No. 3,400,456, reissued on Oct. 2, 1973 as U.S. Pat. No. Re. 27,766, thin-film resistors and capacitors may be adjusted to value by the formation through their metallic and dielectric films of apertures. These apertures either remove material from a film, thereby decreasing its effective area (and increasing resistance) or penetrate the film and connect it to an adjacent film, thereby increasing the effective area of the first film (decreasing resistance).

It has been found that a taper which is inward from the top to the bottom of the aforementioned apertures or windows if often desirable. Such a taper is shown in U.S. Pat. No. 3,808,069.

These tapers, where the aperture top is wider than its bottom, are desirable especially where subsequent processing steps involve steps such as irradiation or material deposition. Without the taper, "shadowing" may be caused by vertical or inwardly sloping walls. Specifically, irradiation and deposition occur as though the impinging energy or the material being deposited were emanating along a line of sight from a remote point source. If an inward, top-to-bottom taper is not present, locations at the bottom of the aperture, window, etc., may be shielded or shadowed by upper parts of the aperture wall and not receive their proper irradiation or deposited material.

It has also been found that processes such as ion implantation which require window formation to expose a surface to be treated, are best carried out when the window has an inward top-to-bottom taper. Moreover, for related reasons, moats formed in mesa devices are usually desired to have tapered walls. Lastly, it has also been found convenient to taper the holes used to adjust the value of thin-film devices.

Chemical methods are known for providing the desired tapers as described in the aforementioned U.S. Pat. No. 3,808,069 patent. These methods are slow, costly, time consuming and involve much handling which results in high-product breakage.

Laser-implemented methods of forming blind holes are also well known. See, for example, "Scribing of $Al_2O_3$ Material by YAG and $CO_2$ Lasers" a paper presented by U. C. Paek and V. J. Zaleckas at the fall meeting of the American Ceramic Society, Electronic Division in Denver, Sept. 18–20, 1974. Most of the methods involve a "brute-force" approach, whereby holes are literally "blasted" through a rather massive article. In some cases tapers have been observed, and these have been attributed to at least two factors:

1. Because the massive articles are quite thick the hole formed by the laser ultimately has a quite appreciable depth. That is, the hole bottom moves away or recedes from the laser during hole formation, the beam is defocused which causes less energy to be transferred to the receding hole bottom.

2. Again, because the massive articles are thick, the holes, even at intermediate formation stages, are quite deep. Molten components collect in these deep holes, leading to an inefficient transfer of energy from the beam to the hole bottom.

Both factors may tend to produce tapers because, as compared to hole formation at its earlier stages, holes formed during times of lessened or inefficient energy transfer are smaller. This tapering effect is quite unpredictable, and in fact, was felt by earlier workers to be undesirable. It was eliminated either by using very high power lasers, which form holes of appreciable depth by almost instantaneous vaporization, or by tailoring the wavelength of the laser to effect more efficient absorption of energy by the articles. These latter expedients often lead, however, to undesirable debris on the articles' surface surrounding the hole.

SUMMARY OF THE INVENTION

Accordingly, an object of this invention is a method of controlled formation of tapered apertures in thin films with a beam of coherent radiant energy, which method is more desirable than chemical methods and obviates the difficulties of prior laser hole-forming methods.

A source of coherent radiant energy is operated to produce a pulsed beam of the energy which is impinged on a selected site of a first surface of a thin film. The material of the film has optical characteristics such that it absorbs much, if not most, of the beam's energy and, if the power density of the beam is sufficient, it is potentially at least partially vaporizable by the beam. A temperature gradient between the first surface and a second, opposed surface of the film soon exists. The beam impingement is terminated before both surfaces are at the same temperature, that is, before the gradient is zero. This successive impingement/non-impingement effects a series of energy pulses, successive ones of which are directed at the site until an aperture of a desired depth is formed. This use of one or more energy pulses, each of which has a duration shorter than the time it takes the temperature gradient between the surfaces to reach zero, results in apertures in the thin film having the desired taper. The film and the beam may be relatively moved to impinge the pulses at an overlapping succession of sites to form a kerf or moat having tapered walls.

DETAILED DESCRIPTION

Figure 1:
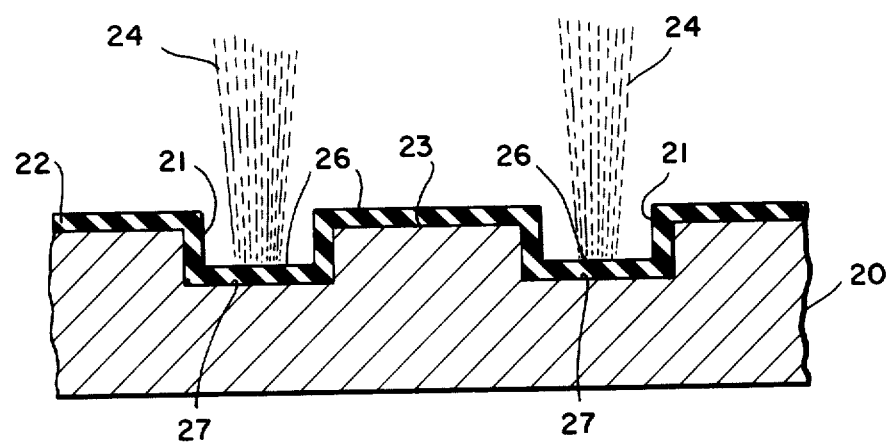
FIG. 1 is a partial cross-sectional view of a typical semiconductor substrate having at least one moat formed therein and a thin masking layer thereover.

An initial consideration of the present method is to define the materials and dimensions of the "thin films" with which the present method is usable. The term thin film in this detailed description and in the claims has the meaning ascribed to it immediately below.

From a materials standpoint, the thin films may be dielectric films such as silicon dioxide ($SiO_2$) grown thermally (in steam or dry $O_2$) or pyrolytically; silicon nitride ($Si_3N_4$); and oxides of tantalum (e.g., $Ta_2O_5$); these materials may be alone or in sandwiches, and doped or undoped. The thin films usable herewith may also be metallic films including "Nichrome" resistance films, the so-called film-forming metals, such as gold, tantalum, aluminum, and niobium, as well as other materials such as silicon (doped or undoped).

Dimensionally, the thin films hereof have thicknesses of between about 400A. and about 10,000A. About 400A. is used herein as a lower limit, because below about that thickness some problems with uniformity and reproducibility are experienced. Above about 10,000A., the films begin to act as the bulk material.

Thus, thin film, herein means a dielectric or metal film having a thickness between about 400A. and about 10,000A., a portion of which film is potentially vaporizable by a beam of coherent radiant energy, giving consideration to the light-absorptive and heat-conductive properties of the thin film, as well as to the dominant wavelength of the laser and the energy density of the beam.

According to an important aspect of this invention, a pulse of coherent radiant energy is applied to a thin film, as defined above. The duration of the pulse is shorter than a thermal time constant $\tau$ for the thin film. $\tau$ is functionally defined as the time it would take for the second surface of the thin film to reach the temperature of the first surface after the application of thermal energy (for example an impinging beam of coherent radiant energy) to the first surface. Mathematically, $\tau$ is defined as $$\tau = X^2/4K_{td}$$

where $X$ is the thickness of the film between the two surfaces (i.e., the distance between these surfaces), and $K_{td}$ is the coefficient of thermal diffusivity. $K_{tc}$ in turn is defined by the equation $$K_{td} = k_{tc}/\rho C_p$$

where $k_{tc}$ is the coefficient of thermal conductivity of the material of the thin film, $\rho$ is its density and $C_p$ is its specific heat, all in consistent units. Thus $$\tau = X^2/(4K_{td}) = (X^2 C_p \rho)/(4k_{tc})$$

Again, $\tau$ has been found to be the time for the second surface to reach the same temperature as the first surface after heat flux is applied to the first surface. Of course, the exact numerical value of the temperature depends on the intensity of the radiant energy as well as the optical and thermal properties of the material.

It has been discovered that if the duration of the coherent radiant energy pulse or pulses is substantially the same as or exceeds $\tau$ no taper will be formed. Rather, a hole will be blasted through the thin film. Moreover, if the thin film overlies a substrate which is affected by the energy, it too may have a possibly undesirable hole formed therein.

Thus, the present method utilizes a radiant energy pulse of a duration less than $\tau$, so that the pulse terminates before the temperature gradient between the surfaces is zero, that is, before the surfaces reach the same temperature.

It is postulated that in a thin film, the use of such pulses prevents the blasting of apertures by preventing portions of the film much beyond the precise point of beam impingement to reach vaporization temperatures by limiting lateral and normal heat flow. Only those portions immediately adjacent beam impingement are heated sufficiently to vaporize. After vaporization and removal due to a first pulse or a first few pulses, a new part of the thin film is heated by the next pulse. The duration of this next pulse is again kept sufficiently short, as described above, to prevent vaporization of any but the immediately adjacent portions of the thin film. Of course, the parts of the thin film immediately above, that is, those heated by the last succeeding pulse, may retain some of this prior heat as well as being heated by such next pulse. The additive effect of these heat quanta is to remove additional material, which removal is manifested by a slight enlargement of the aperture previously formed. As long as the film is thin, as defined above, this additive heat effect continually results in vaporization of new material at the bottom of the aperture as well as further vaporization of material above the bottom to enlarge the aperture without blasting a hole through the film. Obviously, this sequence ultimately leads to an aperture which is tapered, i.e., wider at the top than at the bottom.

It is further postulated that blasting through is obviated and tapered holes are fostered by the better control over lateral heat flow in the thin film afforded by the short duration pulses.

In effect, as contrasted with blasting techniques, the method herein may be viewed as the controlled "pecking away" of measured amounts of material. When the energy pulses have durations less than $\tau$ blasting does not occur and uniform, reproducible tapered holes are formed.

To iterate, the last three paragraphs set forth only theory. However, it has been experimentally verified and observed that the use of radiant energy having a wavelength absorbed by the thin film and a power density sufficient to evaporate the material of the film, will form tapered apertures if the energy is pulsed and the pulses have a duration less than $\tau$.

The method hereof may be used to form single holes, or holes in a pattern. X-Y tables or any other convenient facility may be used to effect relative movement of the film and the beam if a pattern of holes is desired.

A tapered aperture according to the present invention may be formed with only a few pulses. Of course, quite a large number of pulses may be necessary. The beam is pulsed at the same site until a tapered hole of a desired depth is formed. This depth may be such as to form a "blind" hole or aperture, i.e., one only partly through the thickness X of the thin film, or an aperture completely through the thin film, for example, to expose a surface at the bottom of the aperture.

If instrumentalities are used to relatively move the beam and the thin film they may be operated so that successive beam impingement sites "overlap." This expedient produces a kerf or moat having a tapered wall similar to the walls of the tapered apertures. Multiple moats may be formed in the thin film, as for example, on an orthogonal grid to define multiple mesas.

The type of laser is not crucial. Rather, the laser need be a member of a general class capable of generating short pulses having durations less than $\tau$ of the thin film to be machined, and having sufficiently high power densities to effect evaporation of the particular material used, as is well known. Typical types of lasers are Q-switched $CO_2$ lasers, and cavity dumped or mode-locked YAG or Argon lasers. It is desirable to select a laser having a wavelength which provided maximum absorption in the thin film and, in a multilayered structure, minimum absorption in the underlying layers. This expedient minimizes the possibility of subsurface explosion in the structure.

Figure 2:
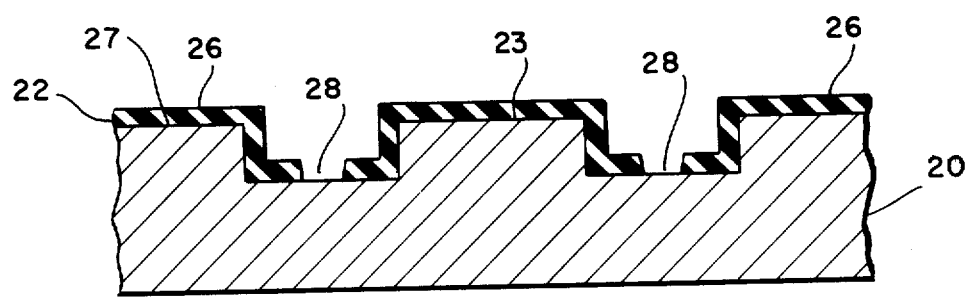
FIG. 2 is a partial cross-sectional view of the substrate of FIG. 1 which has a tapered aperture formed in the thin masking layer within the moat.

Reference is made to FIG. 1 which illustrates a typical semiconductor substrate 20, e.g., a silicon wafer with strata or regions (not shown) of different conductivity such as N-type, P-type. Substrate 20 has, for illustrative purposes, at least one moat 21 formed therein. A thin-film masking layer 22, e.g., a dielectric layer comprising $SiO_2$ or $Si_3N_4$, etc., covers the top surface 23 of substrate 20. A suitable energy beam 24 from a laser source (not shown) is directed at moat 21. Energy beam 24 is, as described above, one which has an appropriate power density and wavelength for the particular material comprising thin film or layer 22, e.g., for $SiO_2$, a Q-switched $CO_2$ laser having a wavelength of at least 9.3μ. Energy beam 24 is directed at moat 21 and impinges on top surface 26 of masking layer or film 22 contained therein to establish a temperature gradient between surface 26 and bottom surface 27 of layer 22. The impingement of beam 24 is terminated before the temperature gradient between surfaces 26 and 27 is zero, whereby a tapered aperture 28 is formed as shown in FIG. 2. As discussed above, the duration or length of time for the impingement is less than $\tau$. Also as discussed above, a plurality of energy pulses from the laser source may be required to obtain tapered aperture 28 of a desired depth.

PREFERRED EMOBIDMENTS — EXAMPLES

EXAMPLE I

It was desired to open a window or aperture in a thermally grown $SiO_2$ thin film about 5,000A. thick on a silicon wafer, the window to have a width of 2-3 mils (50.8–76.2μ) traversing the wafer. Because the window was to be used for subsequent field plate deposition onto silicon exposed at the bottom of the aperture, a taper was desired to obviate any shadowing thus eliminating the possibility of discontinuities in the field plate. $\tau$ for the thin film was calculated to be about 0.3μs. Given the radiant energy absorptive characteristics of $SiO_2$ and of the underlying silicon and the value for $\tau$, a Q-switched $CO_2$ laser (at a wavelength of 10.6μ) was selected. Uniform and similar tapered apertures were formed in the $SiO_2$ with pulses 250 nsec long.

EXAMPLE II

The procedure of Example I was repeated except that to enhance the absorption of the radiant energy in the flim, the $CO_2$ laser was Q-switched at 9.3μ rather than at 10.6μ. This lead to a significant increase in the percentage of energy absorbed by the film and reduced the peak power required to reach vaporization. The pulse length was not significantly altered by tailoring the Q-switched $CO_2$ wavelength to the higher absorption of $SiO_2$ at 9.3μ.

Another typical application of the subject invention includes trimming capacitor to value. In trimming film capacitors to value, it is desired to selectively vaporize portions of a gold counterelectrode separated from an underlying electrode by a dielectric layer. Q-switched YAG lasers having pulse lengths of 70–400 nanoseconds have been used to this end, often resulting, however, in the undesirable shorting together of the electrodes.

The gold counterelectrode is usually about 5,000A. thick and accordingly, has a $\tau$ of about 0.7 nanoseconds. Thus, the undesirable shorting may be seen to be due to the pulse duration being much longer than $\tau$.

Use of the method of the present invention results in formation of tapered apertures and effects a controlled removal or pecking away of the gold so that shorts are obviated. Specifically, knowing that $\tau$ is about 0.7 nanoseconds, a mode locked, cavity-dumped argon laser capable of emitting pulses having durations less than 0.5 nanosecond may be selected.

Because many changes and modifications may be made without departing from the spirit and scope of the claims herein, it is intended that all matter in the above specification shall be considered as illustrative only and not in a limiting sense.

What is claimed is:

1. A method of forming a tapered aperture in an outer surface of a thin film machinable by an energy beam, the thin film having a thickness $X$ and thermal and optical characteristics such that a temperature gradient is establishable between the outer surface of the thin film and an inner surface thereof upon impingement of the beam on the outer surface, which method comprises:

impinging the beam on a selected site on the outer surface in a series of pulses, each having a duration less than $\tau$, where $$\tau = X^2/4K_{td} = (X^2C_p\rho)/(4k_{tc}),$$

and where $K_{td}$ is the coefficient of thermal diffusivity of the film material, $C_p$ is the specific heat of the film material, $\tau$ is the density of the film material, and $k_{tc}$ is the coefficient of thermal conductivity of the film material, whereby each pulse terminates before said temperature gradient is zero, so as to form a tapered aperture of a desired depth.

2. The method of claim 1, wherein the thin film has a thickness $X$ of between about 400A. and 10,000A.

3. An apertured film produced by the method of claim 2.

4. A method of forming a tapered aperture in a thin film through a first surface thereof, the film having a thickness X between the first surface and a second surface, the material of the film being vaporizable by an energy beam having an appropriate power density and wavelength, which method comprises:
   a. impinging the beam on the first surface to establish a temperature gradient between the surfaces;
   b. terminating the impingement in a time less than $$\tau = X^2/4K_{td}$$

where $K_{td}$ is the coefficient of thermal diffusivity of the film material, whereby the impingement termination is effected before the gradient is zero; and
   c. repeating steps (a) and (b) until a tapered aperture of a desired depth is formed.

5. The method of claim 4 wherein the energy beam is coherent radient energy and $X$ is between about 400A. and 10,000A.

6. An apertured film produced by the method of claim 5.

7. A method of forming a tapered aperture in a thin film at a selected site on a first surface thereof, the film having a predetermined thickness $x$ between the first surface and a second surface, the film being of a material which is vaporizable by the impingement thereon of an energy beam having an appropriate power density and wavelength, which method comprises:
   a. impinging the beam on the first surface at the site to establish a temperature gradient between the surfaces; and
   b. terminating the impingement in a time less than $\tau$, where $$\tau = X^2/4K_{td},$$

where $K_{td}$ is the coefficient of thermal diffusivity of the film material, whereby the impingement termination is effected before the gradient is zero.

8. The method of claim 7 which further comprises repeating steps (a) and (b) until a tapered aperture of a desired depth is formed.

9. An apertured film produced by the method of claim 7.